(12) United States Patent
Wang et al.

(10) Patent No.: US 6,552,708 B1
(45) Date of Patent: Apr. 22, 2003

(54) UNIT GAIN BUFFER

(75) Inventors: Bo-Wen Wang, Taipei (TW); Jun-Ren Shih, Changhua (TW); Shang-Li Chen, Hsinchu (TW)

(73) Assignee: Industrial Technology Research Institute (TW)

( * ) Notice: Subject to any disclaimer, the term of this patent is extended or adjusted under 35 U.S.C. 154(b) by 175 days.

(21) Appl. No.: 09/657,259

(22) Filed: Sep. 7, 2000

(51) Int. Cl.$^7$ .................................................. G04G 3/36
(52) U.S. Cl. ............................ 345/98; 345/100; 345/92; 345/87
(58) Field of Search ............................ 345/98, 100, 87, 345/92; 327/151; 330/269, 267, 296

(56) References Cited

U.S. PATENT DOCUMENTS

| | | | | | |
|---|---|---|---|---|---|
| 4,433,305 A | * | 2/1984 | Ozawa et al. | ................ | 330/296 |
| 4,481,481 A | * | 11/1984 | Sleeth et al. | ................ | 330/269 |
| 4,712,047 A | * | 12/1987 | Weindorf | .................... | 315/397 |
| 4,833,424 A | * | 5/1989 | Wright | ....................... | 330/267 |
| 4,853,610 A | * | 8/1989 | Schade, Jr. | ................. | 323/316 |
| 5,331,285 A | * | 7/1994 | Marshall et al. | ............ | 324/713 |
| 5,519,328 A | * | 5/1996 | Bennett | ...................... | 324/684 |
| 5,621,374 A | * | 4/1997 | Harkin | ........................ | 337/151 |
| 6,046,577 A | * | 4/2000 | Rincon-Mora et al. | ..... | 323/282 |

* cited by examiner

Primary Examiner—Steven Saras
Assistant Examiner—Alicia D. Nelson

(57) ABSTRACT

The present invention is related to a unit gain buffer of the driver circuit to drive the data line in the filed of LCD data driver, further to be preferably applied to the new TFT-LCD processing of low temperature poly-silicon. This invention is using the plurality of PMOS transistor connection to result in the almost same value between the Vout and Vin. There is no using of the feedback connection in this invention, so the using of the compensation capacitor can be avoided, furthermore the data driver layout area of the LCD driver can be reduced. This invention can improve the defect of the larger layout area result from the prior art.

10 Claims, 5 Drawing Sheets

UNIT GAIN BUFFER

BACKGROUND OF THE INVENTION

1. Field of the Invention

The present invention relates to a unit gain buffer to reduce the layout area of the data driver in LCD, further to be preferably applied to the new TFT-LCD processing of low temperature poly-silicon.

2. Background of the Invention

Recently, the TFT-LCD is popularly applied to the computer, communication, and consumer product due to the image processor and monitor are greatly improved under the optoelectronics and the semiconductors make progress. In addition to the desk top personal computer monitor and the portable computer screen, the mobile phone, PDA, and palm PC are all using the LCD panel frequently. Relatively, the drivers that used to drive the LCD panel become more important in the LCD filed.

The main drivers in the normally TFT-LCD driver circuits include the scan driver and the data driver. In the data driver, the signals are transmitted in the digital signal type. When the signals drive the every one pixel of the TFT, the signals must be changed into the analog type to driver the pixels of the TFT. Generally, the data drivers use a digital-to-analog converter to transfer the digital signals into the analog signals to drive the pixel. In the TFT-LCD panel, every one data line needs one stage of the data driver to drive. But the digital-to-analog converters can not driver the next large load likes as the data line of the display panel. There always need a unit gain buffer to perform the data line driving for every stage of the driver.

Presently, the data drivers use the OP amplifier (OP AMP) in the negative feedback connection to be a unit gain buffer to drive the data line. The prior art of the unit gain buffer shown in FIG. 1, is related about the conventional one stage data driver 30 for one data line of TFT-LCD panel. The data driver 30 comprises a digital-to-analog converter (D/A converter) 10 coupled to a unit gain buffer 20. The unit gain buffer 20 consist of an OP 22 connected in the negative feedback network to form a unit gain.

The main disadvantage of FIG. 1 is that the layout area of the driver circuit be large. When the data driver 30 uses the OP 22, even use the lo simplest two stage OP amplifiers, we always need the compensation capacitor to compensate the feedback frequency response in the driver circuit. The compensation capacitor results in larger layout area of the driver circuit. Although some OP amplifiers connection type dot not need the compensation capacitor connection, the numbers of the transistor gates of the other OP amplifier connection are more than the two stages type's. So those OP amplifier connection types either can not to reduce the layout area of the driver circuit.

The different driver circuits of the data driver in the TFT-LCD panel further include using the source follow connection to be a driver. The source follow connection driver comprises the NMOS and PMOS connection, further comprises the switching element connection. The using of the switching circuit make the driver circuit be more complex and need larger layout area then this invention. This invention proposes a unit gain buffer, which only use the PMOS transistor connection. By using this invention, the driver circuit layout area can be reduced under the driving power, the driving rate and the voltage level precision in the same situation.

SUMMARY OF THE INVENTION

The present invention relates to a unit gain buffer of a data driver in the TFT-LCD panel, which consisted of plurality PMOS transistor connection. There is no feedback network in this invention to avoid the use of the compensation capacitor.

That is, the primary object of this invention is to reduced the buffer layout area of data driver in the TFT-LCD under the situations of the driving power, the driving speed and the voltage level precision not be affected.

The other object of this invention is mainly to be applied to the new TFT-LCD processing of low temperature poly-silicon to reduce the buffer layout area of data driver.

In order to achieve the purpose described above, the unit gain buffer of TFT-LCD panel data driver in this invention including an input transistor M1 connected to a constant current source I1 via the source pole of M1. The gate pole of M1 being the input Vin of the unit gain buffer.

There is also a high bias transistor consisted of transistors M2 and M3 with series connection in the unit gain buffer, and the series connection point is mark A. The gate pole of M3 connected to Vin. The source pole of M2 connected to the constant current source I1. Further the gate pole of M2 connected to the drain pole of M3 and with a constant current source I2.

The output of the unit gain buffer is an output transistor M4 that connected to a constant current source I3 via the drain pole of M4. The drain pole of M4 is to be the output voltage Vout of the unit gain buffer and connected to the gate pole of M4. The source pole of M4 connected to the connection point A between M2 and M3.

As mention above, the voltage of point A is almost the same as the input Vin, there is only difference Vgs of M3 between the point A and Vin, that is Vin=$V_A$−Vgs3. By using the M4 transistor, we can get the Vout=$V_A$+Vgs4 and let the Vgs3 is almost the same as Vgs4, then Vout is almost the same as Vin.

For the preferred embodiment, the described input transistor M1 is using PMOS transistor operating in the saturation region due to the Vgd is more than zero voltage under normally operation. Further the M2 and M3 are also using the PMOS transistors operating in the saturation region under/normally operation.

For the preferred embodiment, when the Vout and Vin of the described unit gain buffer are all in low level, and then the Vin is changed into high level suddenly, the M1 and M3 being changed into OFF state immediately. The constant current source I1 charging into the load via the M2 and M4 that form a charging current path.

For the preferred embodiment, when the Vout and Vin are all in high level, and then the Vin is changed into low level suddenly, the M1 is changed into linear region immediately and produces a large current. The large current flows into the drain pole of M4 via the N-well contact to output. That is the large current is from drain pole into body pole to form a current path, and this is the same as M2 to form a current path, so the M2 and M4 produce a discharging current path.

For the preferred embodiment, the unit gain buffer applied to the low temperature poly-silicon TFT fabrication process. Wherein the Vout and Vin in are all in high level and then the Vin is changed into low level suddenly, there is only constant current source I3 provided discharge mainly, further the M4 leakage current is also to form a discharge current path.

BRIEF DESCRIPTION OF THE DRAWINGS

The foregoing features of the present invention may be more fully understood from the following detailed description, read in conjunction with the accompanying drawings, wherein.

DETAILED DESCRIPTION OF THE PREFERRED EMBODIMENT

This invention provides a unit gain buffer by using the plurality of PMOS transistor connection to result in the nearly same value between the Vout and Vin. The unit gain buffer of this invention is mainly applied to the data driver of TFT-LCD panel. There is no using about the feedback connection in this invention, so the using of the compensation capacitor can be avoided, furthermore the data driver layout area of the LCD driver can be reduced. So that this invention can improve the defect of the larger layout area result from the prior art efficiently.

Figure 1:
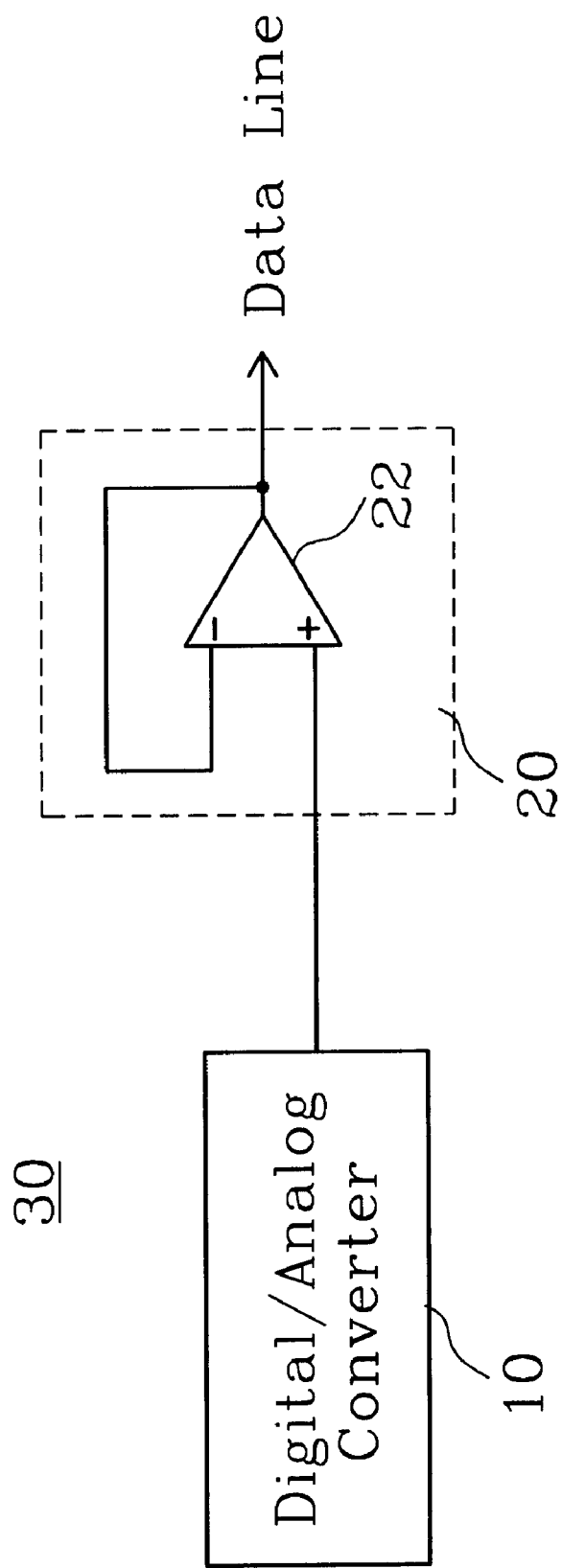
FIG. 1 is a schematic illustration of the prior art of the conventional data driver in TFT-LCD panel, shows the data driver use a unit gain buffer to drive the data line of TFT-LCD.
Figure 2:
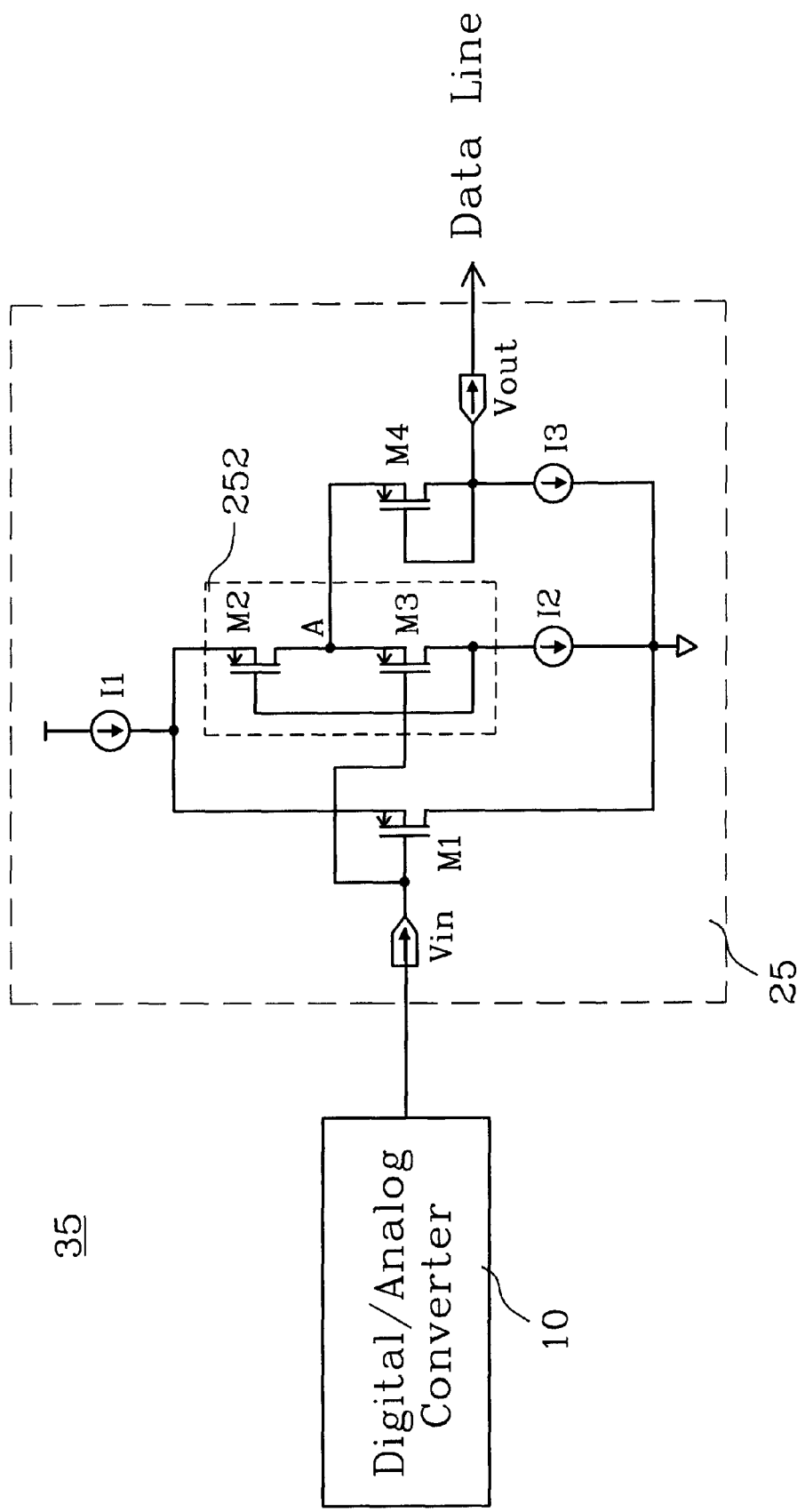
FIG. 2 is a schematic illustration of the embodiment of a unit gain buffer according to the present invention.

The basic connection of the unit gain buffer of this invention is shown in FIG. 2, there is a schematic illustration of the embodiment of a unit gain buffer according to the present invention. Comparing with FIG. 1, the data driver 35 of FIG. 2 is different from the data driver 30 of FIG. 1. The data driver 35 includes a digital-to-analog converter (D/A converter) 10 connected to a novel frame unit gain buffer 25, then coupled to the data line.

The unit gain buffer 25 is an important element of this invention, which comprising an input transistor M1. The gate pole of M1 is the input Vin of the unit gain buffer 25, which connected to the output of digital-to-analog converter 10. Further M1 is connected to a constant current source I1 via the source pole of M1. In this embodiment, we use the PMOS to be M1 that operating in the saturation region due to the voltage Vgd is more then zero voltage. The current value through the M1 is to be I1-I2-I3 under the normally operation, so the Vgs is only verified in a little range. In FIG. 2, there is also a high swing bias transistor 252 in the unit gain buffer 25, which consisted of two transistors M2 and M3 in series connection. The series connection point between M2 and M3 is mark A. The gate pole of M3 is connected to Vin. The source pole of M2 connected to the constant current source I1. Further the gate pole of M2 connected to the drain pole of M3 and with a constant current source I2.

The connection of M2 and M3 is generally present in the high swing bias circuit, which enforce the M2 and M3 operating in the saturation region. If there is no M1 connected, then a fixed voltage be existed between the source pole of M2 and the point A. The fixed voltage will make M3 operating in the linear region that out of the normally operation. So the input transistor M1 connection is necessary to enforce M3 operating in saturation region.

The output of the unit gain buffer 25 in FIG. 2 is an output transistor M4 that connected to a constant current source I3 via the drain pole of M4. The drain pole of M4 is to be the output voltage Vout of the unit gain buffer and connected to the gate pole of M4. The source pole of M4 connected to the connection point A between M2 and M3. In normally operation, the M1~M3 are operating in the saturation region, so the voltage A ($V_A$) is follow the input voltage Vin. That is, the voltage of point A is almost the same as the input Vin. There is only difference Vgs of M3 between the point A and Vin, wherein Vin=$V_A$−Vgs3 By using the M4 transistor, we can get the Vout=$V_A$+Vgs4 and let the Vgs3 is same as Vgs4, then Vout is almost the same as Vin. Furthermore, the M1~M4 are all the PMOS type transistors, in which the Vth could hardly be changed to make the Vout be more close to the Vin.

Figure 3:
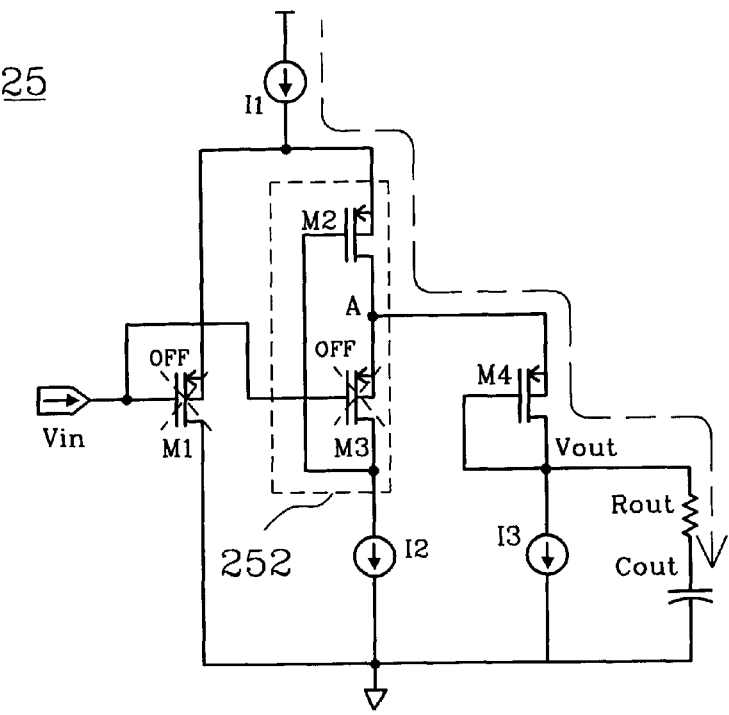
FIG. 3 is a schematic illustration of the embodiment of a current direction when the buffer is charged according to the present invention.

The current flow of this invention can be divided into charge current path and the discharge current path. For describing the charging path of the unit gain buffer 25, shown in FIG. 3, that when the Vout and Vin are all in low level, and then the Vin is changed into high level suddenly, the M1 and M3 being changed into OFF state immediately. With reference to FIG. 3, the constant current source I1 charge into the load Rout and Cout via the M2 and M4 that form a charging current path shown as dash line in FIG. 3. FIG. 3 is a schematic illustration of the embodiment of a current direction when the buffer is charged according to the present invention. The dash line in FIG. 3 represents the Cout charged by I1 through M2 and M4. The charged voltages of the Rout and Cout are to form the Vout. The series connection of Rout and Cout represents the load that connected with the output of the unit gain buffer 25. Further, the load is also meaning the data line of TFT-LCD panel according to the embodiment of this invention.

Figure 4:
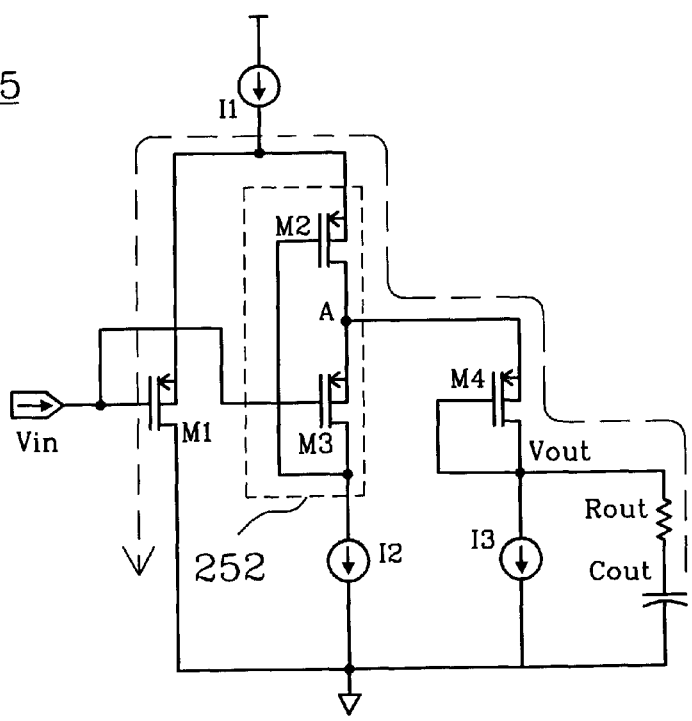
FIG. 4 is a schematic illustration of the embodiment of a current direction when the buffer is discharged according to the present invention.

Please referring to FIG. 4, is a schematic illustration of the embodiment of a current direction when the buffer is discharged according to the present invention, especially in the normally N-well fabrication process. When the Vout and Vin are all in high level and then the Vin is changed into low level suddenly. The M1 is changed into linear region immediately and produces a large current. The large current flows into the drain pole of M4 via the N-well contact to output. That is the large current is from drain pole into body pole to form a current path. This is the same appearance to M2 to form a current path. So the M2 and M4 are to form a discharging current path.

The phenomenon of the current from the drain to body results from the drain voltage is higher than the source voltage of the M4 under the M1 in linear region. According to distinguish the drain pole from source pole of a transistor, the drain pole and source pole of M4 is interchanged. That is the source pole of M4 changed into drain pole, on the contrary, the drain pole of M4 is changed into source pole. So that the voltage Vsb is not equal to zero, Vsb≠0. On the other hand, the gate voltage Vgb=0 to make the source and the body of M4 be positive conduction of a PN junction to produce current flow. As the same reason, the M2 also produce the current flow from drain to body. Therefore, the M4 and M2 are to form a discharging current path shown as dash line in FIG. 4.

In another especially application, the unit gain buffer 25 of this invention can be applied into the fabrication process of Low Temperature Poly-Silicon TFT. Then the discharging current would be different from the N-well CMOS fabrication process. When the Vout and Vin are all in high level, and then the Vin is changed into low level suddenly, there is the only constant current source I3 provided discharge current mainly, further the M4 leakage current is also to form a discharge current path in the fabrication.

In order to prove the performance of this invention, we executed the circuit simulation and made an experiment of the real circuit network. We applied the unit gain buffer 25 of this invention into different element model of the N-well CMOS fabrication process and the Low Temperature Poly-Silicon fabrication process respectively. In the experiment, we only care about the result that comparing inputting different voltage Vin verse the voltage difference Vout-Vin shown as FIG. 5 and FIG. 6.

Figure 6:
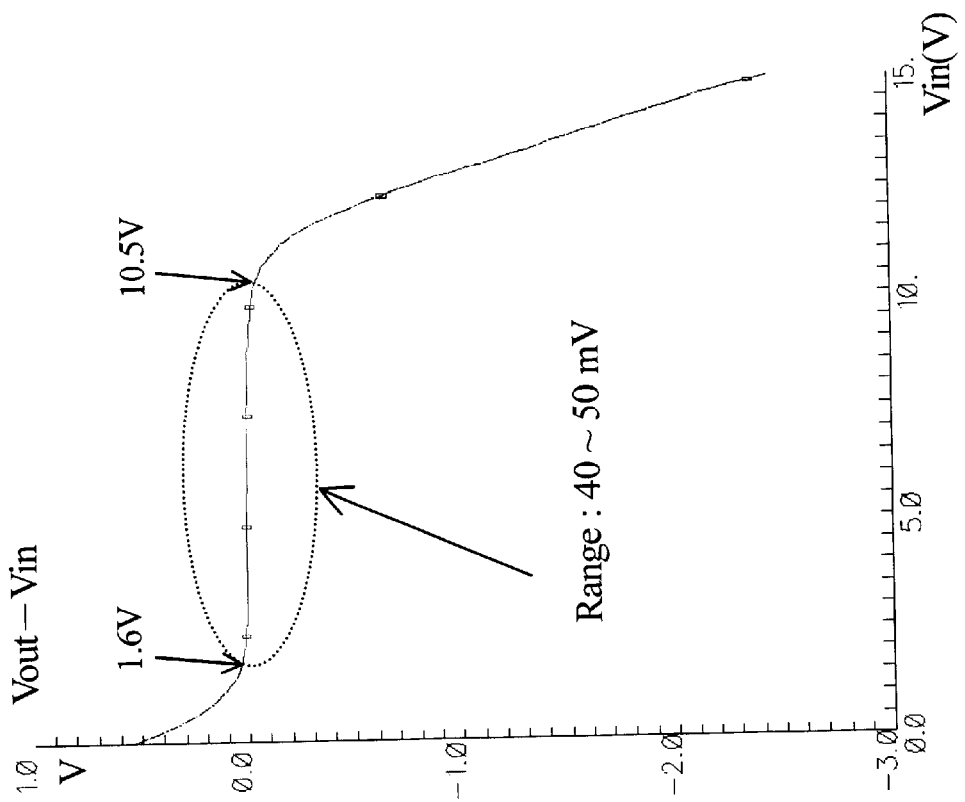
FIG. 6 is a schematic illustration of the embodiment of an experiment result from inputting different voltage level Vin versus the Vout–Vin under the low temperature poly-silicon fabrication process according to the present invention.
Figure 5:
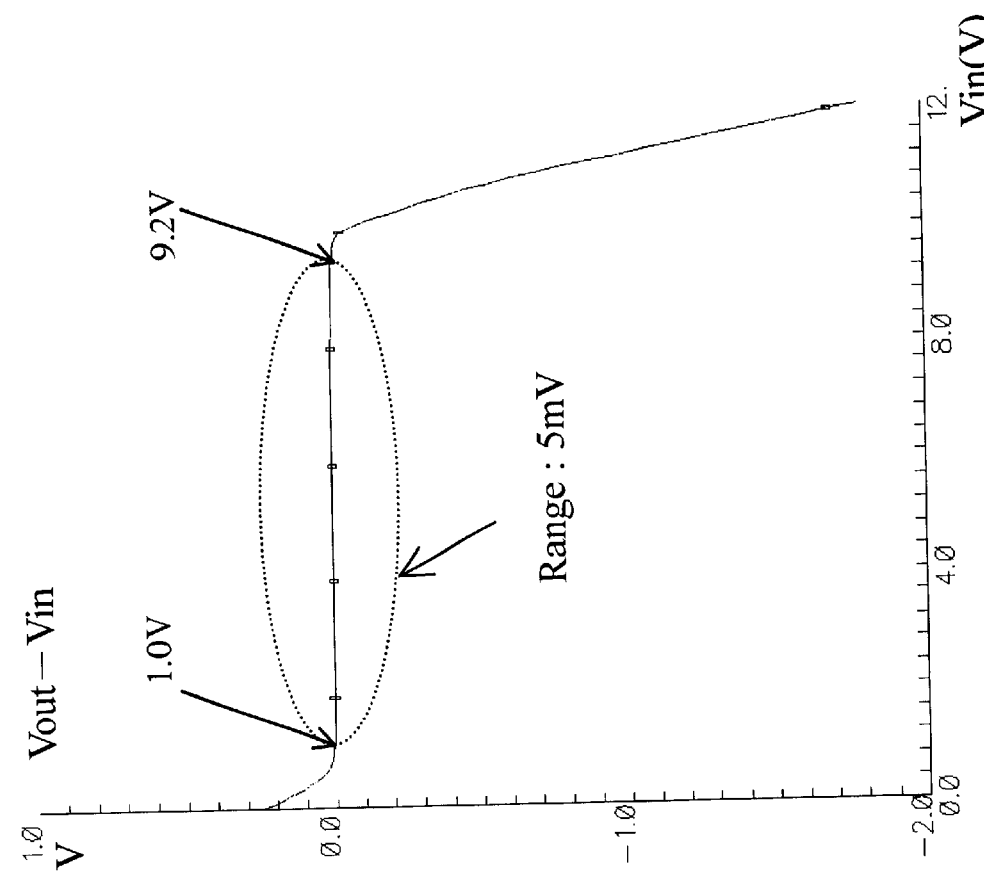
FIG. 5 is a schematic illustration of the embodiment of an experiment result from inputting different voltage level Vin versus the Vout–Vin under the CMOS fabrication process according to the present invention.

Referring FIG. 5, is a schematic illustration of the embodiment of an experiment result from inputting different voltage level Vin (horizontal axis, unit V) versus the Vout-Vin (vertical axis, unit V) under the N-well CMOS fabrication process according to the present invention. The input Vin is between 1.0V to 9.2V result in the variation range of the Vout-Vin is only 5 mV. FIG. 6 is a schematic illustration of the embodiment of an experiment result from inputting different voltage level Vin (horizontal axis, unit V) versus the Vout-Vin (vertical axis, unit V) under the Low Temperature Poly-Silicon fabrication process according to the present invention. It shows the Vin is input from 1.6V to 10.5V, the variation range of the voltage difference Vout-Vin is between 40~50 mV.

The performance of this invention in the N-well CMOS fabrication process is good under FIG. 5 present. The 5 mV variation is conformed to the generally unit gain buffer requirement. On the other hand, the threshold voltage Vth is larger in the Low Temperature Poly-Silicon fabrication process rather than in the N-well CMOS fabrication process. As a whole viewing, the voltage range of the unit gain buffer in the Low Temperature Poly-Silicon fabrication process is limited, so we apply the higher voltage Vin to drive the unit gain buffer, example, using the Vin=15V.

Figure 8:
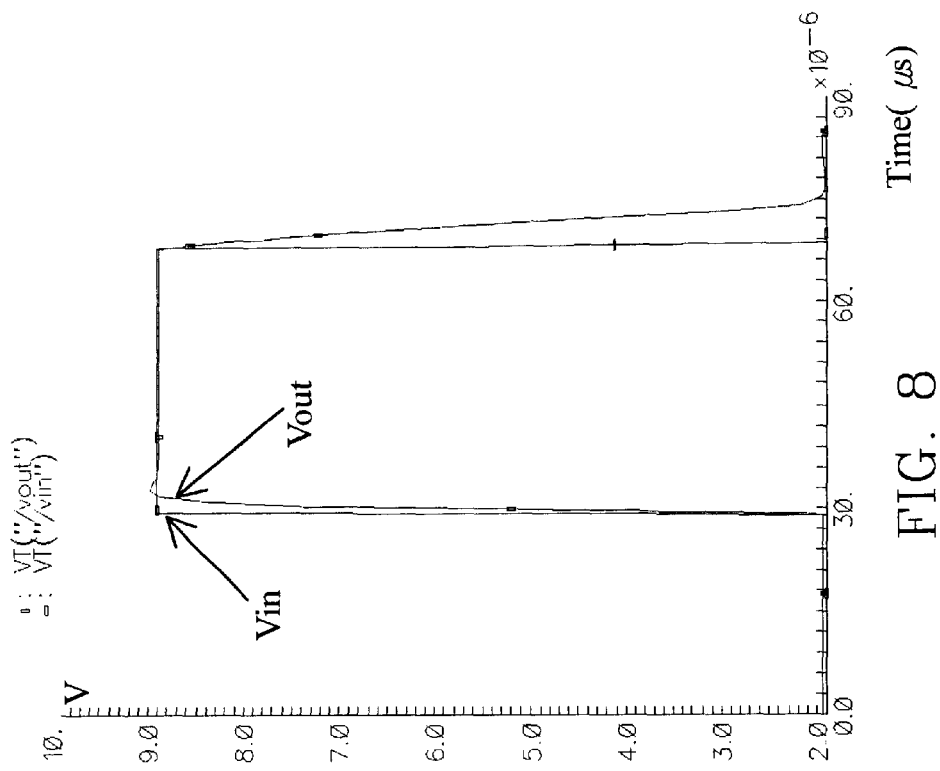
FIG. 8 is a schematic illustration of the embodiment of a step response under the low temperature poly-silicon fabrication process according to the present invention.
Figure 7:
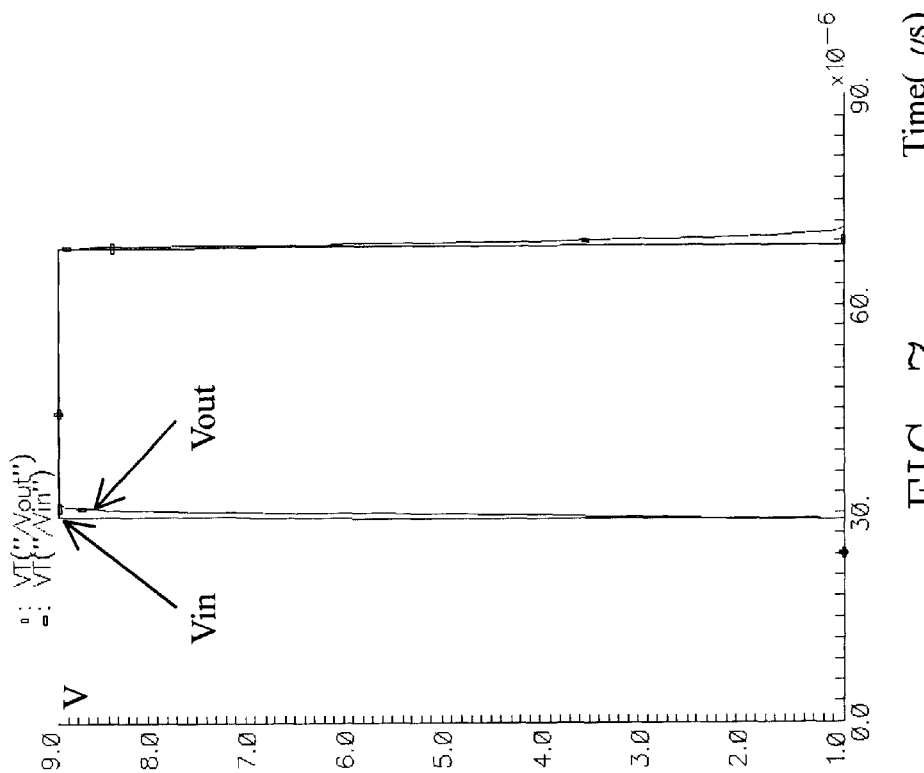
FIG. 7 is a schematic illustration of the embodiment of a step response under the CMOS fabrication process according to the present invention.

This invention further analyzed the transient response of the unit gain buffer in the N-well CMOS fabrication process and the Low Temperature Poly-Silicon fabrication process respectively. FIG. 7 is a schematic illustration of the embodiment of a step response under the CMOS fabrication process according to the present invention. FIG. 8 is a schematic illustration of the embodiment of a step response under the low temperature poly-silicon fabrication process according to the present invention. The horizontal axis is time with unit $10^6$ second($\mu s$), the vertical axis is voltage in FIGS. 7 and 8. They show that this invention is in good performance of the transient response no matter what in charging or discharging mold.

As mention above, this invention is good in the transient response and the precision level. For the layout area, the prior art using the two stage OP amplifier need the feedback connection to form a unit gain buffer, further the feedback network need a larger compensation capacitor result in larger layout area. There is no feedback connection in this invention, the compensation capacitor is neglected, so that the layout area of data driver can be reduced efficiently.

Another prior art of the data driver buffer is the source follower connection that including the NMOS and PMOS connecting each other. The source follower even use the switches to promote the precision performance, but the circuit design will be more complex due to the switches controlling. Therefore, it also needs larger layout area then this invention.

While this invention has been described in connection with what is presently considered to be the most practical and preferred embodiment, it is to be understood that the invention is not limited to the disclosed embodiments, but on the contrary, it is intended to cover various modifications and equivalent arrangements included within the spirit and scope of the appended claims.

We claim:

1. A unit gain buffer for reducing the layout area of the data driver in TFT-LCD panel, comprising:

an input transistor M1 connected to a constant current source I1 via the source pole of M1, the gate pole of M1 being the input Vin of the unit gain buffer;

a high bias transistor consisted of transistors M2 and M3 in series connection, the gate pole of M3 connected to Vin, the source pole of M2 connected to the constant current source I1, further the gate pole of M2 connected to the drain pole of M3 and with a constant current source I2;

an output transistor M4 connected to a constant current source I3 via the drain pole of M4, the drain pole of M4 being the output Vout of the unit gain buffer and connected to the gate pole of M4, the source pole of M4 connected to the connection point A between M2 and M3;

wherein, the voltage of point A is almost the same as the input Vin, there is only difference Vgs of M3 between the point A and Vin, that is Vin=VA−DVgs3, by using the M4 to make the Vout=VA+Vgs4 and Vgs3 is same as Vgs4, then Vout is almost the same as Vin; and when the Vout and Vin are all in high level, then the Vin is changed into low level suddenly, the M1 is changed into linear region immediately and produces a large current, the large current flows into the drain pole of M4 via the N-well contact to output, that is the large current is from drain pole into body pole to form a current path, and this is the same as M2 to form a current path so the M2 and M4 produce a discharging current path.

2. The unit gain buffer of claim 1, wherein said input transistor M1 is using PMOS transistor operating in the saturation region due to the Vgd is more than zero voltage under normally operation.

3. The unit gain buffer of claim 1, wherein said M2 and M3 are using the PMOS transistors operating in the saturation region under normally operation.

4. The unit gain buffer of claim 1, when the Vout and Vin are all in low level, then the Vin is changed into high level suddenly, the M1 and M3 being changed into OFF state immediately, the constant current source I1 charging into the load via the M2 and M4 that form a charging current path.

5. The unit gain buffer of claim 4, wherein said load is also meaning the data line of TFT-LCD panel according to the embodiment of this invention.

6. A unit gain buffer for reducing the layout area of the data driver in TFT-LCD panel, comprising:

an input transistor M1 connected to a constant current source I1 via the source pole of M1, the gate pole, of M1 being the input Vin of the unit gain buffer;

a high bias transistor consisted of transistors M2 and M3 in series connection, the gate pole of M3 connected to Vin, the source pole of M2 connected to the constant current source I1, further the gate pole of M2 connected to the drain pole of M3 and with a constant current source I2;

an output transistor M4 connected to a constant current source I3 via the drain pole of M4, the drain pole of M4 being the output Vout of the unit gain buffer and connected to the gate pole of M4, the source pole of M4 connected to the connection point A between M2 and M3;

wherein, the voltage of point A is almost the same as the input Vin, there is only difference Vgs of M3 between the point A and Vin, that is Vin=VA−DVgs3, by using the M4 to make the Vout=VA+Vgs4 and Vgs3 is same as Vgs4, then Vout is almost the same as Vin;

when the Vout and Vin are all in high level, then the Vin is changed into low level suddenly, there is only constant current source I3 provided discharge mainly, and the M4 leakage current is also to form a discharge current path in the low temperature poly-silicon TFT fabrication process.

7. A data driver of TFT-LCD panel to drive a data line, comprising:

a digital-to-analog converter receiving the digital transmission signals transferred into analog signals to drive the pixel;

a unit gain buffer connected to said digital-to-analog converter and coupled to the data line of TFT-LCD panel to drive the data line, comprising:

an input transistor M1 connected to a constant current source I1 via the source pole of M1, the gate pole of M1 being the input Vin of the unit gain buffer, which is a PMOS transistor;

a high bias transistor consisted of two PMOS transistors M2 and M3 in series connection, the gate pole of M3 connected to Vin, the source pole of M2 connected to the constant current source I1, further the gate pole of M2 connected to the drain pole of M3 and with a constant current source I2;

an output transistor M4 connected to a constant current source I3 via the drain pole of M4, the drain pole of M4 being the output Vout of the unit gain buffer and connected to the gate pole of M4, the source pole of M4 connected to the connection point A between M2 and M3, and M4 is a PMOS transistor;

wherein, the voltage of point A is almost the same as the input Vin, there is only difference Vgs of M3 between the point A and Vin, that is Vin=VA−DVgs3, by using the M4 to make the Vout=VA+Vgs4 and Vgs3 is same as Vgs4, then Vout is almost the same as Vin; and wherein said Vout and Vin of the unit gain buffer are all in high level, then the Vin is changed into low level suddenly, the M1 is changed into linear region immediately and produces a large current, the large current flows into the drain pole of M4 via the N-well contact to output, that is the large current is from drain pole into body pole to form a current path, and this is the same as M2 to form a current path, so the M2 and M4 produce a discharging current path.

8. The data driver of TFT-LCD panel of claim 7, wherein said M1 of the unit gain buffer is operating in the saturation region due to the Vgd is more than zero voltage under normally operation, further the M2 and M3 are also in the saturation region under normally operation.

9. The data driver of TFT-LCD panel of claim 7, wherein said Vout and Vin of the unit gain buffer are all in low level, then the Vin is changed into high level suddenly, the M1 and M3 being changed into OFF state immediately, the constant current source I1 charging into the load via the M2 and M4 that form a charging current path.

10. The data driver of TFT-LCD panel of claim 7, wherein said Vout and Vin of the unit gain buffer are all in high level, then the Vin is changed into low level suddenly, there is only constant current source I3 provided discharge mainly, and the M4 leakage current is also to form a discharge current path in the low temperature poly-silicon TFT fabrication process.

* * * * *